United States Patent
Ma et al.

(10) Patent No.: US 6,369,568 B1
(45) Date of Patent: Apr. 9, 2002

(54) FAST SPIN ECHO PHASE CORRECTION FOR MRI SYSTEM

(75) Inventors: Jingfei Ma, Waukesha, WI (US); Xiaohong Zhou, Houston, TX (US)

(73) Assignee: GE Medical Systems Global Technology Company, LLC, Waukesha, WI (US)

( * ) Notice: Subject to any disclaimer, the term of this patent is extended or adjusted under 35 U.S.C. 154(b) by 0 days.

(21) Appl. No.: 09/325,081

(22) Filed: Jun. 3, 1999

(51) Int. Cl.[7] .................................................. G01V 3/00
(52) U.S. Cl. ........................ 324/309; 324/307; 324/314
(58) Field of Search ................................. 324/309, 307, 324/314, 300, 312; 600/410, 412, 459

(56) References Cited

U.S. PATENT DOCUMENTS

| | | | |
|---|---|---|---|
| 4,698,591 A | 10/1987 | Glover et al. | 324/307 |
| 5,378,985 A | 1/1995 | Hinks | 324/309 |
| 5,818,229 A | 10/1998 | Kanazawa | 324/309 |
| 6,160,397 A | * 12/2000 | Washburn et al. | 324/309 |

FOREIGN PATENT DOCUMENTS

| | | |
|---|---|---|
| EP | 0 818 689 | 1/1998 |
| EP | 0 845 684 | 6/1998 |

OTHER PUBLICATIONS

A New Phase Correction Method in NMR Imaging Based on Autocorrection and Histogram Analysis, IEEE Transaction on Medical Imaging, vol. M1–6, No. 1, Mar. 1987 C.B. Ahn, et al.
On Phase Artifacts of High–Field Fast Spin–Echo Images, Zhou, et al. p. 1248.
An Automatic Phase Correction Method in Nuclear Magnetic Resonance Imaging, JMR, Feb. 15, 1990, No. 3, pp. 593–604, Liu, et al.

* cited by examiner

Primary Examiner—Hezron Williams
Assistant Examiner—Tiffany A. Fetzner
(74) Attorney, Agent, or Firm—Quarles & Brady, LLP; Christian G. Cabou

(57) ABSTRACT

A prescan process for an MR fast spin echo (FSE) pulse sequence adjusts the phases of the RF excitation pulse and RF refocusing pulses in the FSE pulse sequence to reduce the spatially invariant phase errors (zeroth order). The prescan process also calculates the value of a readout gradient compensation pulse, a phase-encoding gradient compensation pulse and a slice-select gradient compensation pulse to reduce the first order phase shifts along the readout, phase-encoding, and slice-select gradient axes.

22 Claims, 8 Drawing Sheets

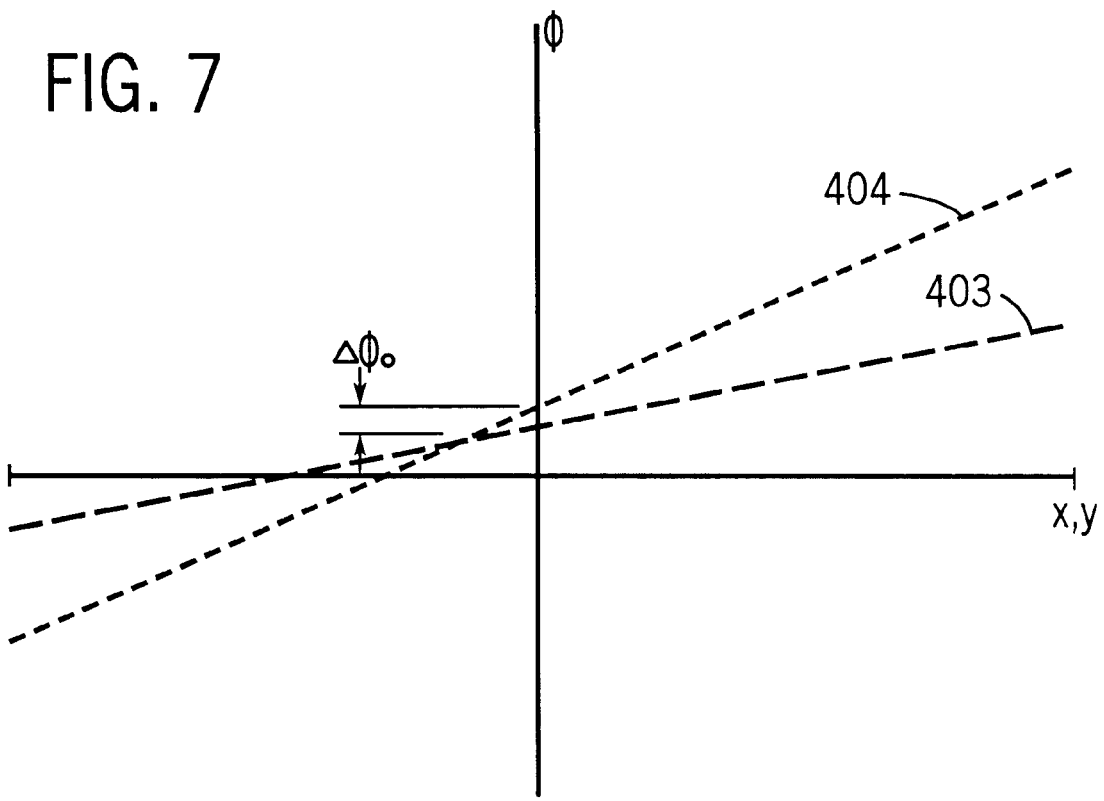

FAST SPIN ECHO PHASE CORRECTION FOR MRI SYSTEM

BACKGROUND OF THE INVENTION

The field of the invention is nuclear magnetic resonance imaging (MRI) methods and systems. More particularly, the invention relates to the compensation of fast spin echo pulse sequences to reduce image artifacts.

When a substance such as human tissue is subjected to a uniform magnetic field (polarizing field $B_0$), the individual magnetic moments of the spins in the tissue attempt to align with this polarizing field, but precess about it in random order at their characteristic Larmor frequency. If the substance, or tissue, is subjected to a magnetic field (excitation field $B_1$) which is in the x-y plane and which is near the Larmor frequency, the net aligned moment, $M_z$, may be rotated, or "tipped", into the x-y plane to produce a net transverse magnetic moment $M_t$. A signal is emitted by the excited spins after the excitation signal $B_1$ is terminated and this "MR" signal may be received and processed to form an image.

When utilizing these signals to produce images, magnetic field gradients ($G_x$, $G_y$ and $G_z$) are employed. Typically, the region to be imaged is scanned by a sequence of measurement cycles in which these gradients vary according to the particular localization method being used. The resulting set of received MR signals are digitized and processed to reconstruct the image using one of many well known reconstruction techniques. Most MR scans currently used to produce medical images require many minutes to acquire the necessary data. The reduction of this scan time is an important consideration, since reduced scan time increases patient throughput, improves patient comfort, and improves image quality by reducing motion artifacts.

There are pulse sequences which enable scans to be completed in seconds rather than minutes. One of these is the Rapid Acquisition Relaxation Enhanced (RARE) sequence which is described by J. Hennig et al in an article in *Magnetic Resonance in Medicine* 3,823–833 (1986) entitled "RARE Imaging: A Fast Imaging Method for Clinical MR." The RARE sequence is a fast spin echo sequence which utilizes RF refocused echoes generated from a Carr-Purcell-Meiboom-Gill sequence. Such fast spin echo ("FSE") scans are very susceptible to image artifacts caused by such things as eddy currents, $B_0$ instability, gradient amplifier infidelity, magnetic hysteresis and high order Maxwell terms. In U.S. Pat. No. 5,378,985 issued to R. S. Hinks on Jan. 3, 1995 and entitled *"Fast Spin Echo Prescan For MRI Systems"*, a method is disclosed for measuring some of the phase errors prior to each patient scan and altering the fast spin echo pulse sequence to compensate for these errors. While this method provides a substantial reduction in ghost image artifacts, in certain situations where multiple root causes of phase error coexist and interact with each other, artifact free FSE images are difficult to produce.

SUMMARY OF THE INVENTION

The present invention is a process that is performed prior to an FSE scan to adjust the FSE pulse sequence and to thereby reduce phase errors produced by the MRI scanner. More specifically, the process includes: performing the FSE pulse sequence to acquire echo signals from the center of k-space, calculating from the acquired echoes a phase shift and a readout gradient compensation pulse to compensate the FSE pulse sequence for first order phase shifts along the readout gradient axis, performing the FSE pulse sequence to acquire additional echo signals from the center of k-space, calculating from the additional echoes a phase shift and a phase-encoding gradient compensation pulse to compensate the FSE pulse-sequence for zeroth and first order phase shifts along the phase-encoding gradient axis, performing the FSE pulse sequence to acquire another echo signal from the center of k-space, and calculating from the another echo signal a slice-select gradient compensation pulse to compensate the FSE pulse sequence for phase shifts along the slice-select gradient axis. As each gradient axis is compensated, the FSE pulse sequence used to acquire additional central k-space echoes is modified to compensate phase errors.

BRIEF DESCRIPTION OF THE DRAWINGS

FIG. 7 is a graphic representation of the phase error measurements made with the pulse sequences of FIGS. 4–6.

DESCRIPTION OF THE PREFERRED EMBODIMENT

Figure 1:
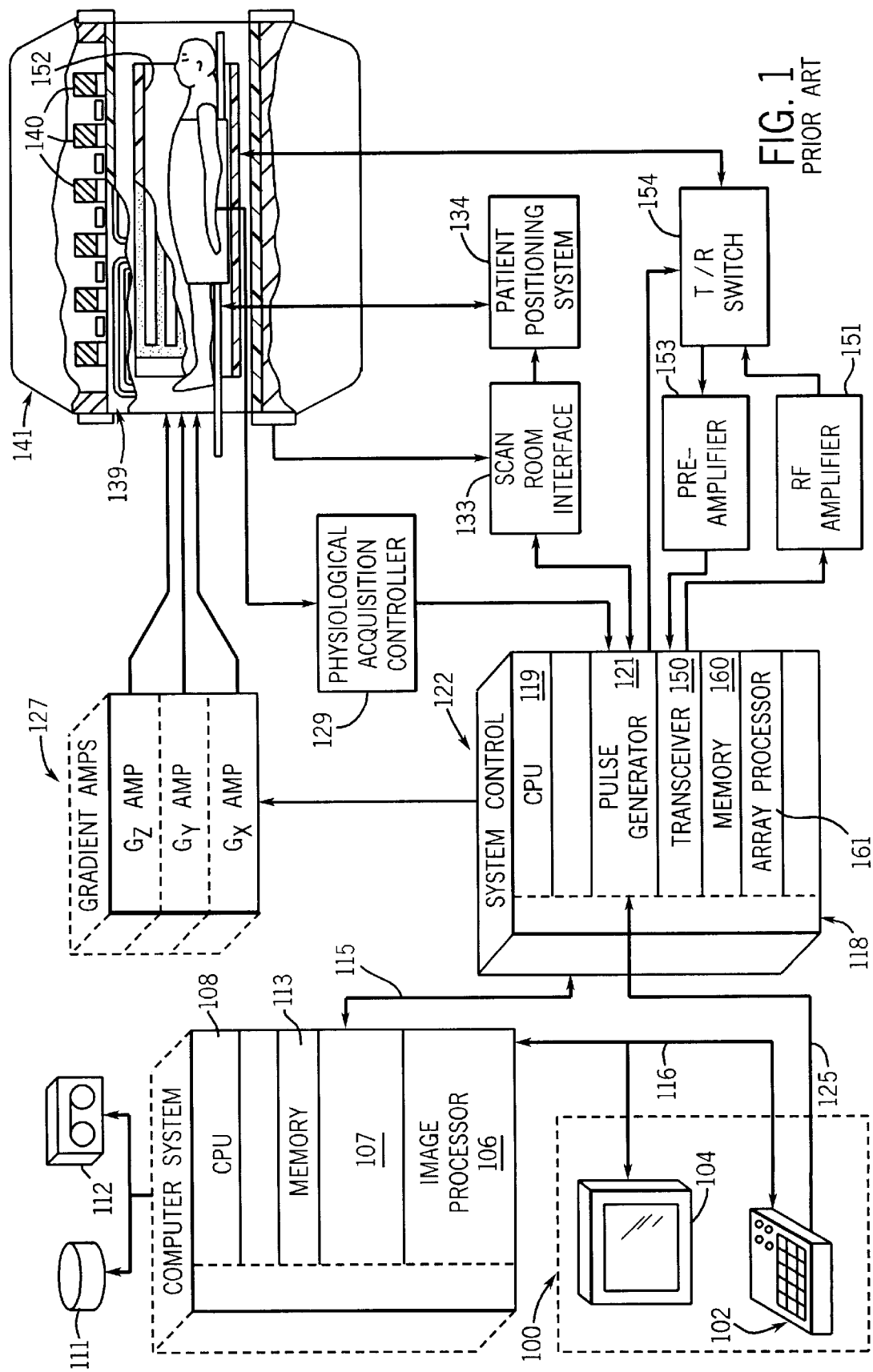
FIG. 1 is a block diagram of an MRI system which employs the present invention.

Referring first to FIG. 1, there is shown the major components of a preferred MRI system which incorporates the present invention. The operation of the system iscontrolled from an operator console 100 which includes a keyboard and control panel 102 and a display 104. The console 100 communicates through a link 116 with a separate computer system 107 that enables an operator to control the production and display of images on the display 104. The computer system 107 includes an image processor module 106, a CPU module 108 and a memory module 113. The computer system 107 is linked to a disk storage 111 and a tape drive 112 for storage of image data and programs, that it communicates with a separate system control 122 through a high speed serial link 115.

The system control 122 includes a CPU module 119 and a pulse generator module 121 which connects to the operator console 100 through a serial link 125. It is through this link 125 that the system control 122 receives commands from the operator which indicate the scan sequence that is to be performed. In response to these commands the pulse generator module 121 produces data which indicate the timing, strength and shape of the RF excitation pulses, the timing and length of the data acquisition window, and it connects to a set of gradient amplifiers 127, to control the timing and shape of the gradient pulses to be produced during the scan. The pulse generator module 121 also receives patient data from a physiological acquisition controller 129 that receives signals from a number of different sensors connected to the patient and it connects to a scan room interface circuit 133 which receives signals from various sensors associated with the condition of the patient and the magnet system. It is also through the scan room interface circuit 133 that a patient positioning system 134 receives commands to move the patient to the desired position for the scan.

The gradient waveforms produced by the pulse generator module 121 are applied to a gradient amplifier system 127 comprised of $G_x$, $G_y$ and $G_z$ amplifiers. Each gradient amplifier excites a corresponding gradient coil in an assembly generally designated 139 to produce the magnetic field gradients used for spatially encoding the acquired MR signals. The gradient coil assembly 139 forms part of a magnet assembly 141 which also includes a polarizing magnet 140 and a whole-body RF coil 152.

A transceiver module 150 in the system control 122 produces pulses which are amplified by an RF amplifier 151 and coupled to the RF coil 152 by a transmit/receive switch 154 to produce the RF excitation field $B_1$. The MR signals radiated by the excited nuclei in the patient may be sensed by the same RF coil 152 and coupled through the transmit/receive switch 154 to a preamplifier 153. The transmit/receive switch 154 is controlled by a signal from the pulse generator module 121 to electrically connect the RF amplifier 151 to the coil 152 during the transmit mode and to connect the preamplifier 153 during the receive mode.

The MR signals picked up by the RF coil 152 are filtered, demodulated using a reference signal, and digitized by the transceiver module 150 and transferred to a memory module 160 through backplane 118 in the system control 122. When the scan is completed and an entire array of data has been acquired in the memory module 160, an array processor 161 Fourier transforms the data into an array of image data. This image data is conveyed through the serial link 115 to the computer system 107 where it is stored in the disk memory 111.

Figure 2:
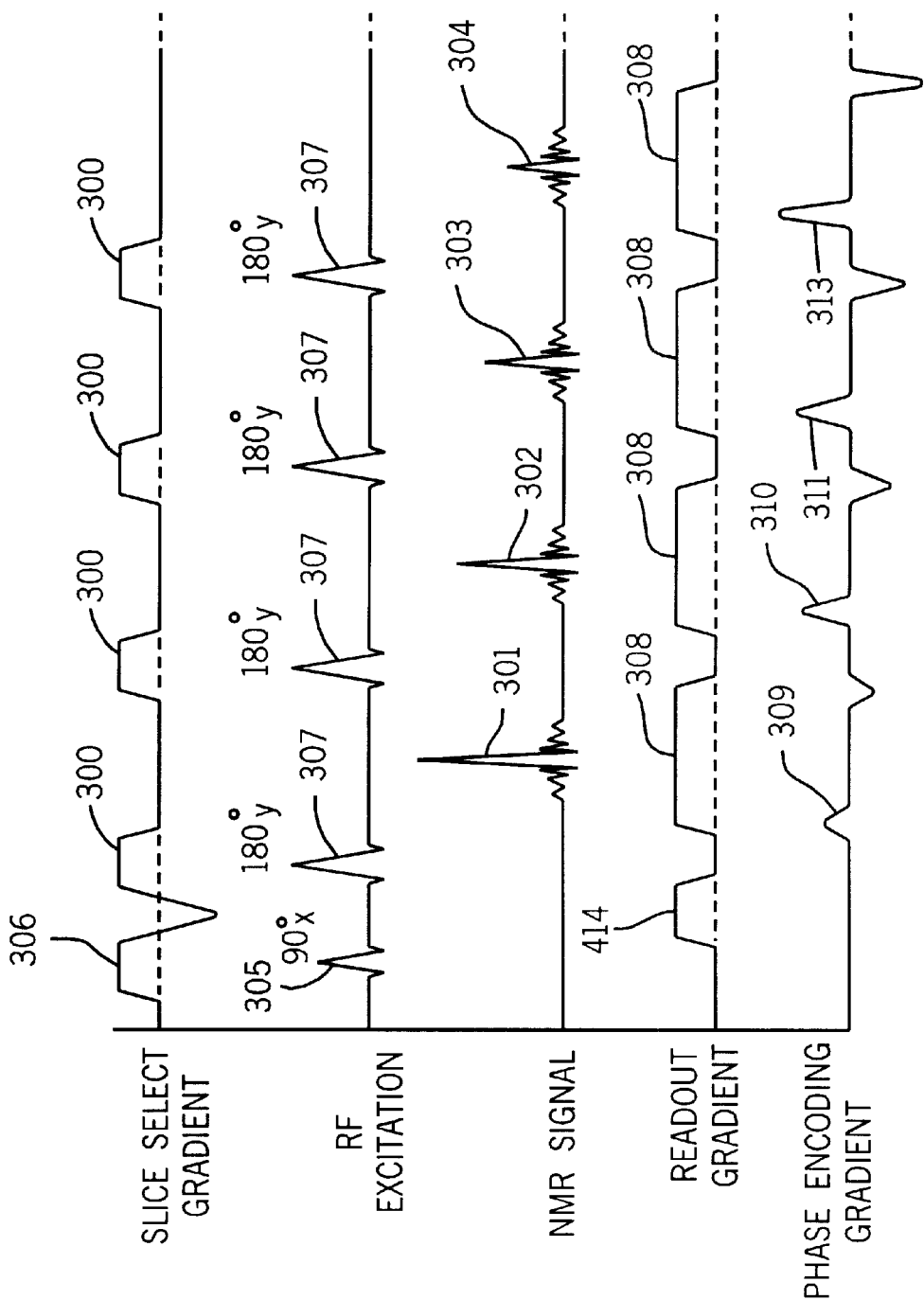
FIG. 2 is a graphic representation of a prior art FSE pulse sequence.

Referring particularly to FIG. 2, the fast spin echo MR pulse sequence to be compensated is a 2DFT RARE sequence in which sixteen MR echo signals are acquired. For clarity, only four echo signals 301–304 are shown in FIG. 2, but it can be appreciated that twelve more are produced and acquired. These MR echo signals are produced by a 90° RF excitation pulse 305 which is generated in the presence of a $G_z$ slice-select gradient pulse 306 to provide transverse magnetization in a slice through the patient. This transverse magnetization is refocused by each of sixteen selective 180° RF refocusing pulses 307 and concurrent slice-select gradient pulses 300 to produce the MR spin echo signals 301–304 that are acquired in the presence of $G_x$ readout gradient pulses 308. Each MR spin echo signal 301–304 is separately phase encoded by respective $G_y$ phase-encoding pulses 309, 310, 311 and 313. The magnitude of each phase-encoding pulse is different, and it is stepped through 256 values to acquire 256 separate views during a complete scan. Each MR spin echo signal is acquired by digitizing 256 samples of each signal and as a result, at the completion of a scan for one image, a 256 by 256 pixel image is produced by performing a 2D Fourier transformation on the acquired data.

The FSE pulse sequence of FIG. 2 uses a CPMG (Carr-Purcell-Meiboom-Gill) echo train to encode multiple views within a single echo train (or "shot"). These echo signals must be in phase if they are to correctly encode spatial information. Undesired phase shifts in the echo signals result in ghosting, blurring and signal loss in the reconstructed image. Such phase shifts may be spatially independent (i.e. zeroth order) or they may vary as a function of position (i.e. spatially first and higher order) from the system isocenter. One aspect of the present invention is that the zero order and first order phase errors along each of the three gradient axes can be measured during a prescan process, and the FSE pulse sequence may be modified, or compensated, to substantially eliminate image artifacts caused by these undesired phase shifts.

The FSE scan of the preferred embodiment of the invention is performed under the direction of a program executed by the MR system of FIG. 1. As will be now described, in the preferred embodiment, a prescan is performed just prior to the FSE scan and includes the execution of a series of FSE pulse sequences which have been modified to collect the required corrective information. This corrective information is then used to alter the FSE pulse sequence employed during the scan to acquire MR data from which accurate images can be reconstructed. This procedure can also be used as an MRI system calibration process, in which case a separate prescan for each patient may not be required, or it may be greatly simplified.

Figure 3A:
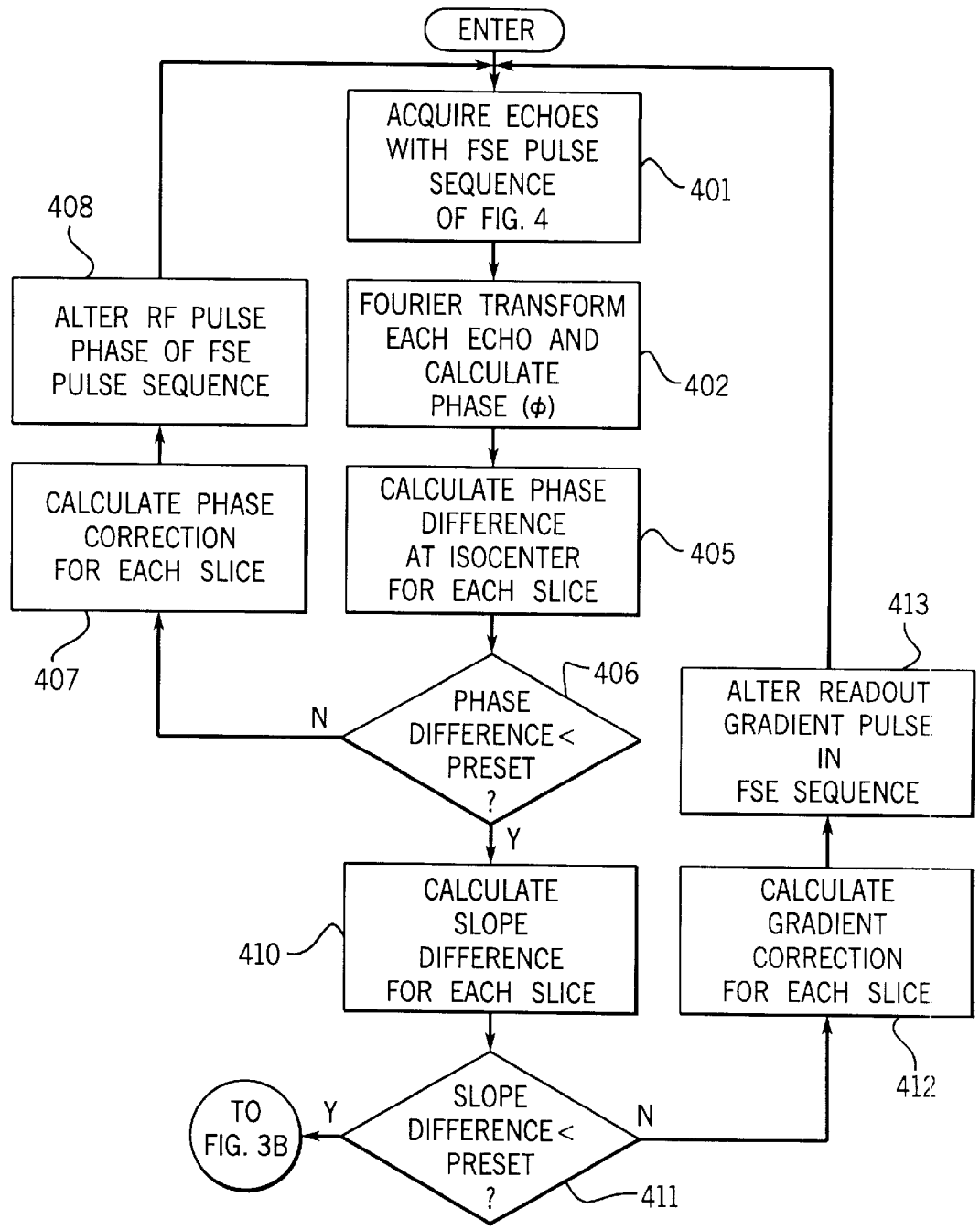
FIG. 3 is a flow chart of the preferred embodiment of the prescan process of the present invention.
Figure 4:
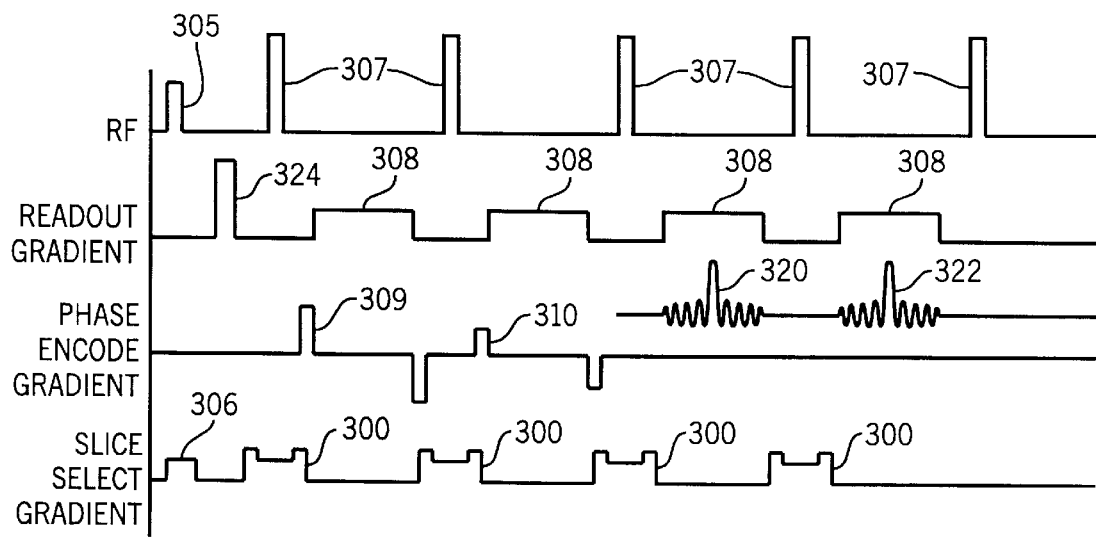
FIG. 4 is a graphic representation of a modified FSE pulse sequence employed to compensate phase errors along the readout gradient axis.

Referring particularly to FIGS. 3A and 4, the first step in the prescan process is to execute the FSE pulse sequence of FIG. 4 as indicated at process block 401. The readout gradients 308 and slice-select gradients 306 and 300 are played out in exactly the same way as the actual FSE pulse sequence of FIG. 2. The phase-encoding gradient pulses (e.g. 309 and 310) are played out in the usual fashion except for two echoes 320 and 322 used to sample the central most views of k-space. The phase-encoding gradient for these central views is turned off. In other words, the FSE pulse sequence shot that acquires the two central-most k-space views is played out and the phase-encoding gradient is turned off before each of the echo signals 320 and 322 is acquired. This modified FSE pulse sequence is repeated for each slice in the scan, and all of the resulting acquired echo signals 320 and 322 are Fourier transformed along the readout axis (x in the preferred embodiment) as indicated at process block 402. The resulting "projection" at each slice location is an array of I and Q magnitude values at locations along the readout axis (x), and these are employed to calculate the phase of the echo signal at each location as follows:

$$\phi = \tan^{-}(I/Q). \quad (1)$$

A plot of these phase values for the first echo signal 320 is illustrated, for example, by dashed line 403 in FIG. 7, and the phase values for the second echo signal 322 is illustrated by dotted line 404. Similar "phase profiles" are calculated for each slice of the scan.

Referring particularly to FIGS. 3A and 7, the next step indicated by process block 405 is to calculate the difference in phase ($\Delta\phi_0$) between the two echo signals 321 and 302 at the readout isocenter. If this phase difference $\Delta\phi_0$ is less than a preset value (for example, 0.50 or 1.0°) no zeroth order correction is required and the process moves onward. Otherwise, the process loops back at decision block 406 and a phase correction calculation is made at process block 407. To correct the zeroth order phase error a correction equal to approximately one half the measured phase difference $\Delta\phi_0$ is calculated, and this angle is added to the phase of each of the 180° RF refocusing pulses 307 to alter their phase with respect to the 90° RF excitation pulse 305. This alteration of the FSE pulse sequence is performed at process block 408 for each slice of the scan.

The procedure is then performed again with the altered FSE pulse sequence for each slice. The process repeats until the phase difference of each slice is within the preset value tested at decision block 406.

Referring particularly to FIGS. 3A and 7, the process continues at process block 410 to correct the FSE pulse sequence for each slice for first order phase shifts along the readout axis. More specifically, the slope ($d\phi_1/dx$) of the phase profile 403 of the first echo signal 320 and the slope ($d\phi_2/dx$) of the phase profile 404 of the second echo signal 322 are calculated and the difference between these slopes ($\Delta d\phi/dx$) is measured. As indicated at decision block 411, if this difference exceeds a preset limit, the prescan loops back to further compensate the FSE pulse sequence for the slice. At process block 412 a correction to the readout gradient area is calculated by dividing the slope difference $\Delta d\phi/dx$ by the gyromagnetic constant $\gamma$ (i.e. 4257 Hz/gauss). As indicated at process block 413, this calculated gradient area adjustment is added to the readout gradient dephaser pulse 414 (FIG. 2) in the FSE pulse sequence of FIG. 4 to form a readout gradient compensation pulse 324. The prescan is then repeated and the readout gradient pulse 324 adjusted until the slope difference $\Delta d\phi/dx$ for each slice is reduced below the preset level tested at decision block 411.

Figure 3B:
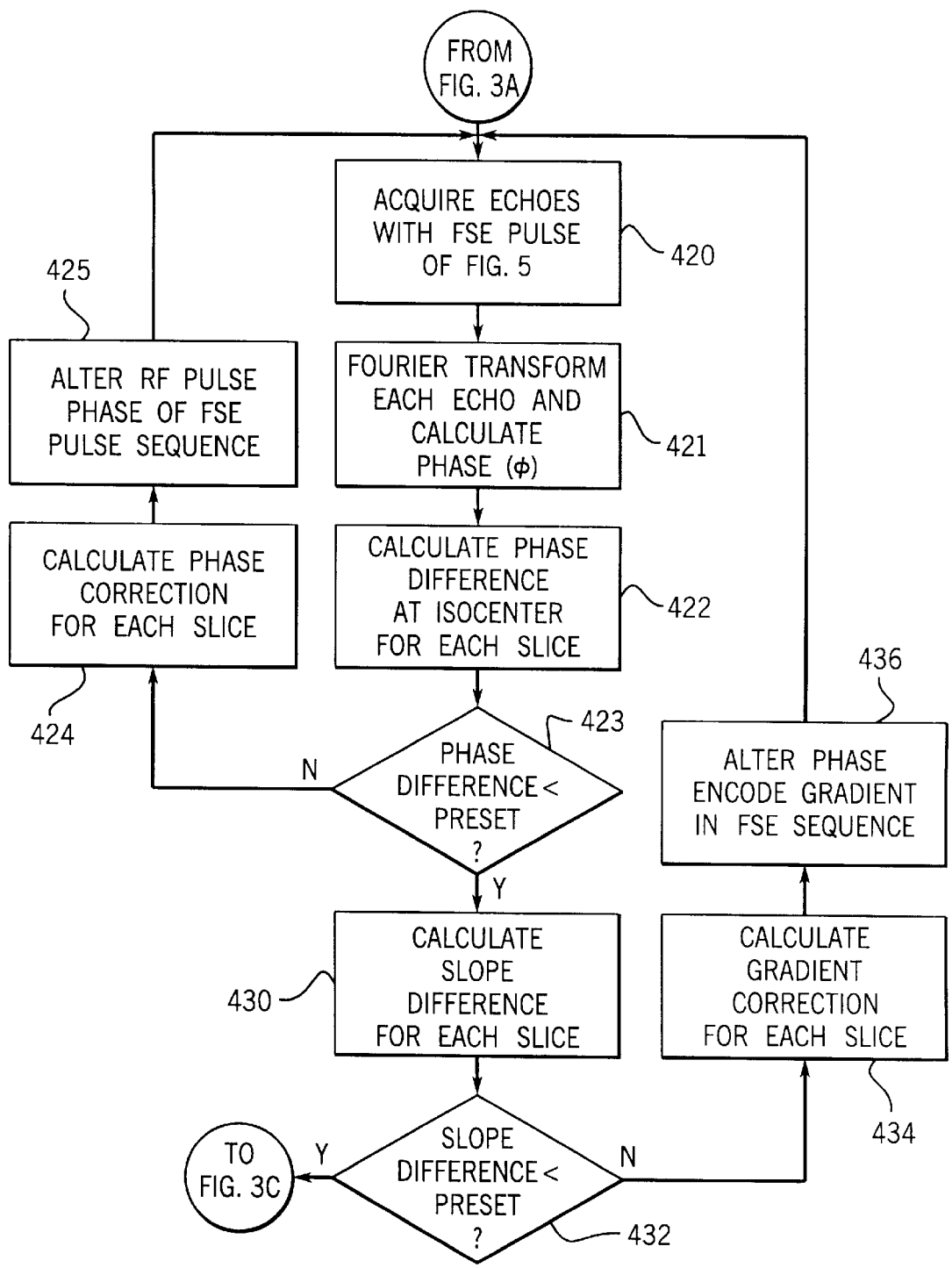
Figure 5:
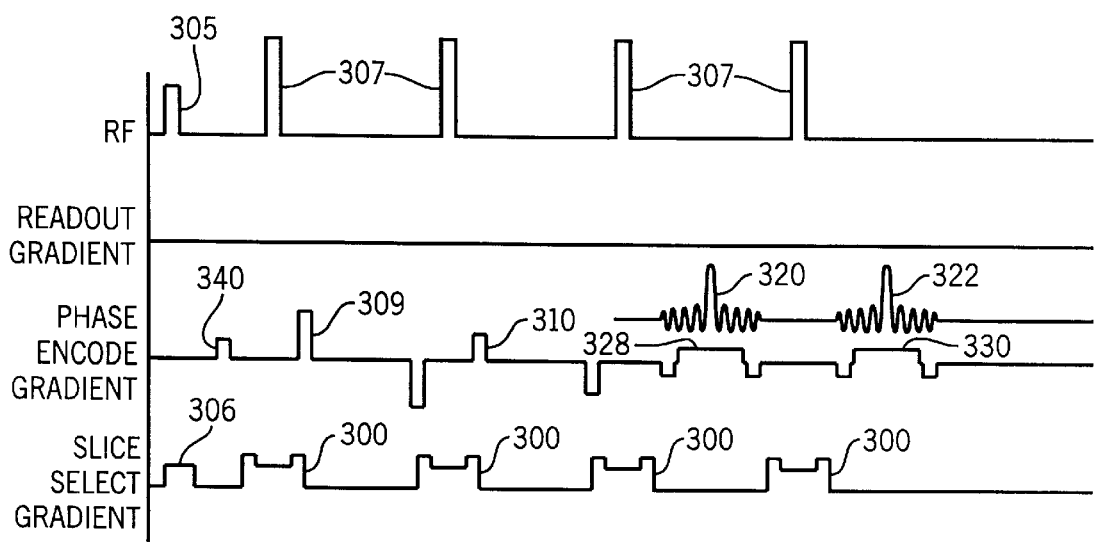
FIG. 5 is a graphic representation of another modified gFSE pulse sequence employed to compensate phase errors along the phase-encoding gradient axis.

In the next part of the prescan procedure, the phase error along the phase-encoding axis in the FSE pulse sequence is measured and compensated. Referring particularly to FIG. 3B, this is accomplished using the FSE pulse sequence of FIG. 5 as indicated at process block 420. This pulse sequence is the same as that in FIG. 2 in many respects such as the RF pulses 305 and 307 and the slice-select gradient pulses 306 and 300, except that the readout gradient pulses 308 and dephaser pulse 324 are turned off. This is indicated in FIG. 5 by the acquisition of the two central-most k-space echo signals 320 and 322 without readout gradient pulses 308. In the phase-encoding direction, the regular phase-encoding gradient pulses (e.g. 309 and 310) are played out in the usual manner throughout the FSE shot, except during the acquisition of the two echo signals 320 and 322 used to sample central k-space views. For these two echo signals, "readout-like" gradient pulses 328 and 330 are produced along the phase-encoding gradient axis. Negative gradient lobes are produced on each side of the readout-like gradient pulses 328 and 330 to nullify the zeroth gradient moment. In addition, the amplitudes of the gradient pulses 328 and 330 and their associated negative lobes are minimized with the echo spacing limit to reduce any additional phase errors which they might produce. This amplitude minimization can be accomplished by selecting a lower readout bandwidth or increasing the field of view during this part of the procedure. Both approaches can be used separately or jointly and will have the added benefit of increased SNR.

Referring particularly to FIGS. 3B and 7, as was done above, both acquired echo signals 320 and 322 are Fourier transformed along the phase-encoding axis at process block 421 and the phase profiles 403 and 404 are calculated. The phase difference ($\Delta\phi_0$) at the y-axis isocenter is again determined from the two phase profiles 403 and 404 at process block 422, and corrections are made if it exceeds a preset amount as determined at decision block 423. If adjustment is needed, a phase correction is calculated at 424 which is substantially onehalf the measured phase difference ($\Delta\phi_0/2$) and it is applied at process block 425 to shift the phase of the 90° RF excitation pulse 305 relative to the RF refocusing pulses 307. This phase adjustment is made to each of the sixteen shots for each slice of the scan until all the corresponding FSE pulse sequences produce a phase difference within the preset limit tested at decision block 423.

Referring still to FIGS. 3B and 7, the next step is to compensate the FSE pulse sequence for each slice for first order phase shifts along the phase-encoding gradient axis (y in the preferred embodiment). As indicated at process block 430, the slope ($d\phi_1/dy$) of the phase profile 403 of the first echo signal 320 and the slope ($d\phi_2/dy$) of the phase profile 404 of the second echo signal 322 are calculated and the difference between these slopes ($\Delta d\phi/dy$) is measured. As indicated at decision block 432, if this difference exceeds a preset limit, the process loops back to further compensate the FSE pulse sequence for the slice. At process block 434 a correction to the phase-encoding gradient is calculated by dividing the slope difference $\Delta d\phi/dy$ by the gyromagnetic constant $\gamma$ to produce a phase-encoding gradient area correction value. As indicated at process block 436, this calculated gradient area adjustment is added to the FSE pulse sequence phase-encoding gradient pulse 340 which is applied after the RF excitation pulse 305 and prior to the first RF refocusing pulse 307. The compensation process is repeated and the phase-encoding compensation pulse 340 adjusted until the slope difference $\Delta d\phi/dy$ for each slice is reduced below the preset level tested at decision block 432.

Figure 3C:
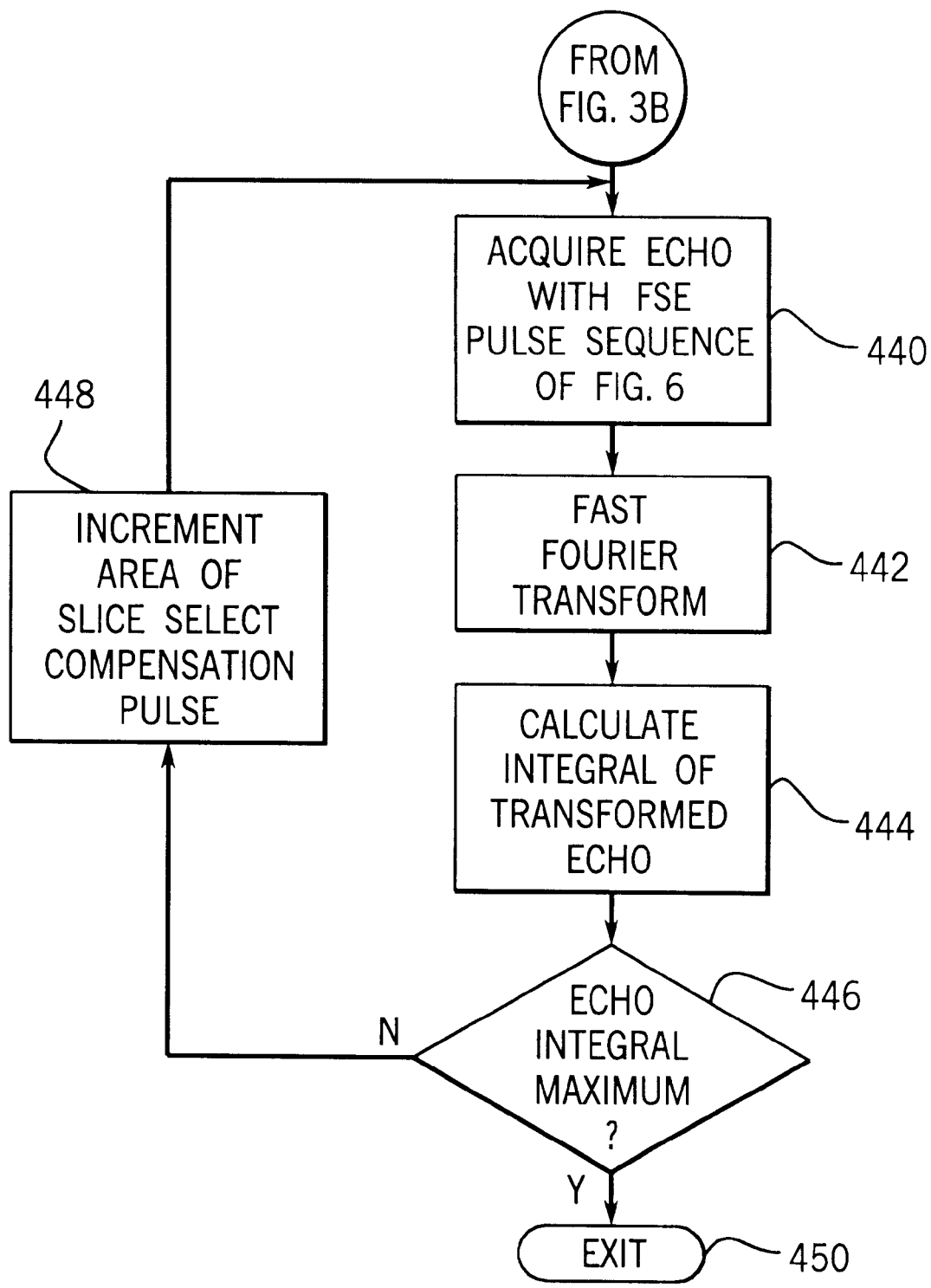

In the third phase of the procedure the phase error along the slice-selection axis due to gradients along all three gradient axes is compensated. Referring particularly to FIG. 3C, this is accomplished as indicated by process block 440 using the pulse sequence in FIG. 6. This pulse sequence employs the same rf pulses 305 and 307 as in the FSE pulse sequence of FIG. 2, but with the phase corrections from the previous steps implemented. Similarly, the readout gradient pulses 308 are the same as in the FSE pulse sequence, but the dephasing gradient pulse 414 is replaced with the readout gradient compensation pulse 324. The normal phase-encoding pulses (e.g. 309 and 310) are applied prior to each echo signal acquisition in the shot, but the phase-encoding is set to zero during acquisition of the two echo signals 320 and 322. As in the previous steps of the procedure, the echo signals 320 and 322 sample the central most views of k-space. The phase-encoding compensation gradient pulse 340 calculated in previous steps is applied to minimize phase errors along the phase-encoding axis and the usual slice-select gradient pulses 306 and 300 are applied.

Figure 6:
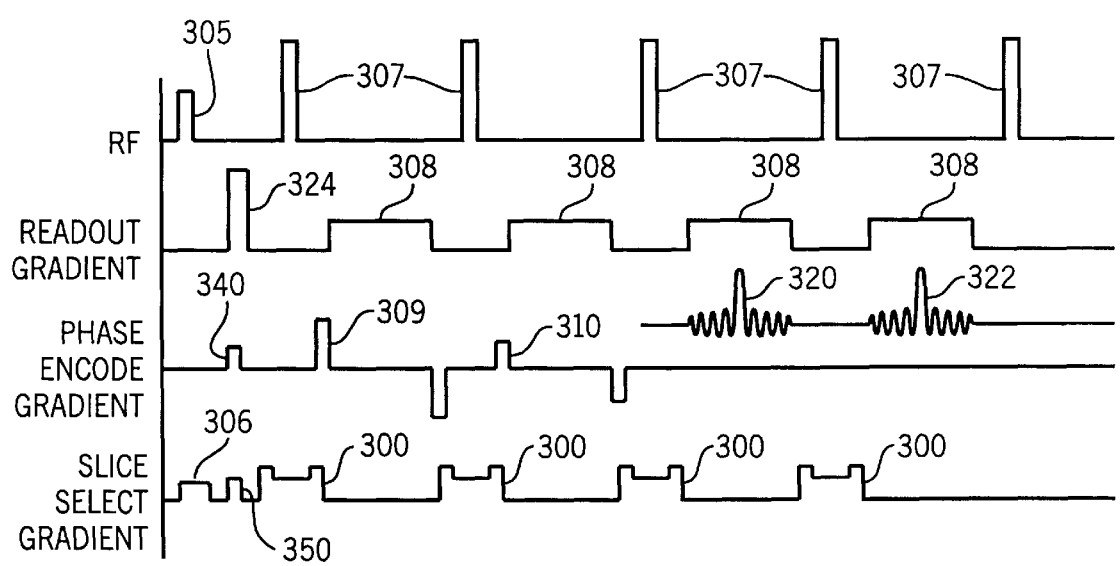
FIG. 6 is a graphic representation of yet another modified FSE pulse sequence employed to compensate phase errors along the slice-selection gradient axis.

The acquired echo signals 320 and 322 are Fourier transformed as indicated at process block 442 and the integral of either transformed signal is calculated at rocess block 444 to measure its area. A test is made at decision block 446 to determine if this integral has reached its maximum possible value, and if not, a slice-select compensation pulse 350 is incremented in value as indicated at process block 448. the modified pulse sequence of FIG. 6 is then used to reacquire the two echo signals 320 and 322 and the integral of the Fourier transformation is again calculated. This integral will increase in value until the area of the slice select compensation pulse 350 is optimal, and then the integral will begin to drop in value. When the maximum integral value is detected at decision block 446, the calibration is complete and the system exits at 450. By maximizing the integral of the central k-space echo in this manner, the first order phase errors along the slice-select gradient axis are compensated.

This completes the FSE compensation process. The phase shifts and the compensation gradient pulses 324, 340 and 350 determined by the compensation process are added to the FSE pulse sequence of FIG. 2 and used to acquire image data from the patient in the usual manner. Phase errors produced by a number of sources are offset by these alterations to the FSE pulse sequence and image artifacts are substantially reduced.

One logical variation in the preferred method described above is to carry out the phase correction along the phase encode and slice-select axes first and do the phase correction along the readout axis as the last step. This variation has the advantage in that the zeroth order phase error is determined using a pulse sequence closely resembling the actual imaging sequence.

Also, in the preferred embodiment the zeroth order phase errors are measured twice, once when measuring phase errors along the phase-encoding gradient axis and once when measuring phase errors along the readout gradient axis. The zeroth order phase shift corrections can be calculated from both measurements or from only one of the measurements. Since the choice does not change total scan time, using both measurements is preferred.

It should be noted that many variations exist in calculating the zeroth and first order phase differences between the two echoes in the central k-space. Although we have described one simple approach to calculate the phase difference (i.e., obtaining the zeroth and first order phases for individual echoes first then take the difference), an alternative way is to first take the phase difference from the complex echo signals then obtain the zeroth and first order phases from the phase difference. This after approach is more immune to the phase-wrap problems. Of course, the phase difference can also be obtained using the algorithm proposed by Ahn and Cho, "A New Phase Correction Method in NMR Imaging Based on Autocorrection and Histogram Analysis", *IEEE Transactions on Medical Imaging*, Vol. MI-6, No. I, March 1987.

What is claimed is:

1. In a magnetic resonance imaging system which performs a scan to acquire MR data using a fast spin echo (FSE) pulse sequence in which an RF magnetic field is produced by an RF excitation pulse followed by a series of RF refocusing pulses and readout, phase-encoding and slice-select magnetic field gradients are applied to spatially encode echo signals that are acquired during the pulse sequence, a prescan in which the FSE pulse sequence is adjusted prior to conducting the scan, which comprises:
    a) acquiring MR data using a first modified FSE pulse sequence;
    b) calculating first order phase error that corresponds to readout gradient corrections from the MR data acquired in step a);
    c) acquiring MR data using a second modified FSE pulse sequence;
    d) calculating first order phase error that corresponds to phase-encoding gradient corrections from the MR data acquired in step c)
    e) calculating zeroth order phase error that corresponds to spatially invariant magnetic field corrections from the MR data acquired in step a) or step c);
    f) acquiring MR data using a third modified FSE pulse sequence;
    g) calculating a first order phase error that corresponds to slice-select gradient correction from the MR data acquired in step f); and
    h) adjusting the FSE pulse sequence with the phase shift corrections calculated in steps b), d), e) and g).

2. The prescan method as recited in claim 1 in which the second modified FSE pulse sequence used in step c) includes phase shift corrections calculated in step b).

3. The prescan sequence as recited in claim 2 in which the third modified FSE pulse sequence used in step f) includes phase shift corrections calculated in step d).

4. The prescan method as recited in claim 1 in which the adjustment made to the FSE pulse sequence in step h) includes adding a readout gradient compensation pulse after the RF excitation pulse and prior to the series of RF refocusing pulses.

5. The prescan method as recited in claim 4 in which the adjustment made to the FSE pulse sequence in step h) includes adding a phase-encoding gradient compensation pulse after the RF excitation pulse and prior to the series of RF refocusing pulses.

6. The prescan method as recited in claim 5 in which the adjustment made to the FSE pulse sequence in step h) includes adding a slice-select gradient compensation pulse after the RF excitation pulse and prior to the series of RF refocusing pulses.

7. The prescan method as recited in claim 6 in which the adjustment made to the FSE pulse sequence in step g) includes changing the relative phase between the RF excitation pulse and the RF refocusing pulses.

8. The prescan method as recited in claim 1 in which the phase shift corrections calculated in step b) are made to the first modified FSE pulse sequence, and steps a) and b) are repeated.

9. The prescan method as recited in claim 8 in which the phase shift corrections calculated in step d) are made to the second modified FSE pulse sequence, and steps c) and d) are repeated.

10. The prescan method as recited in claim 9 in which the phase shift corrections calculated in step g) are made to the third modified FSE pulse sequence, and steps f) and g) are repeated.

11. The prescan method as recited in claim 1 in which the calculations in steps b) and d) includes:
    calculating a phase profile for each of two echo signals in the acquired MR data; and
    calculating the phase difference from the two phase profiles.

12. The prescan method as recited in claim 11 in which the two echo signals both sample near the center of k-space.

13. The prescan method as recited in claim 1 in which the first modified FSE pulse sequence is substantially the same as the FSE pulse sequence to be adjusted except no phase-encoding gradient is applied when two of the echo signals therein are acquired.

14. The prescan method as recited in claim 1 in which the second modified FSE pulse sequence is substantially the same as the FSE pulse sequence to be adjusted except no readout gradient is applied when two of the echo signals therein are acquired and phase-encoding gradients are applied as the two echo signals are acquired.

15. The prescan method as recited in claim 1 in which the third modified FSE pulse sequence is substantially the same as the FSE pulse sequence to be adjusted except no phase-encoding gradient is applied when one of the echo signals therein is acquired.

16. The prescan method as recited in claim 15 in which the calculation in step g) is performed with said one echo signal and includes:
    Fourier transforming the acquired echo signal; and
    integrating the transformed echo signal.

17. The prescan method as recited in claim 1 in which the adjustment made to the FSE pulse sequence in step h) includes adding a slice-select gradient compensation pulse after the RF excitation pulse and prior to the series of RF refocusing pulses.

18. The prescan method of claim 12 in which the first modified FSE pulse sequence is substantially the same as the FSE pulse sequence to be adjusted except no phase-encoding gradient is applied when the echo signals therein are acquired.

19. An MR system which comprises
   a first means for performing a first modified FSE pulse sequence to measure first order phase errors along a readout gradient axis;
   second means for performing a second modified FSE pulse sequence to measure first order phase errors along a phase-encoding gradient axis;
   third means for performing a third modified FSE pulse sequence to measure first order phase errors along a slice-select gradient axis; and
   fourth means for compensating an FSE pulse sequence used to perform an imaging scan using the first order phase errors measured by the first, second and third means.

20. The MR system as recited in claim 19 in which the fourth means includes:
   means for altering the relative phase of RF pulses produced by the MR system when performing said FSE pulse sequence; and
   means for adding compensation gradient pulses that are produced by the MR system when performing said FSE pulse sequence.

21. The MR system as recited in claim 19 in which the first, second and third means include:
   means for producing an RF excitation pulse and a series of RF refocusing pulses;
   means for producing phase-encoding gradient pulses;
   means for producing slice-select gradient pulses when said RF excitation pulse and each of the RF refocusing pulses are produced;
   means for producing a readout gradient pulse; and
   means for acquiring NMR signals produced after each RF refocusing pulse.

22. The MR system as recited in claim 19 in which the first, second and third means each include means for acquiring NMR signals that sample a central region of k-space.

* * * * *